US 011791528B2

(12) United States Patent
Elsherbini et al.

(10) Patent No.: US 11,791,528 B2
(45) Date of Patent: *Oct. 17, 2023

(54) LOW LOSS AND LOW CROSS TALK TRANSMISSION LINES WITH STACKED DIELECTRIC LAYERS FOR FORMING STUBS OF DIFFERENT THICKNESS OR FOR FORMING A COAXIAL LINE (71) Applicant: Intel Corporation, Santa Clara, CA (US)

(72) Inventors: Adel A. Elsherbini, Tempe, AZ (US); Mathew Manusharow, Phoenix, AZ (US); Krishna Bharath, Phoenix, AZ (US); Zhichao Zhang, Chandler, AZ (US); Yidnekachew S. Mekonnen, Chandler, AZ (US); Aleksandar Aleksov, Chandler, AZ (US); Henning Braunisch, Phoenix, AZ (US); Feras Eid, Chandler, AZ (US); Javier Soto, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/714,957

(22) Filed: Apr. 6, 2022

(65) Prior Publication Data
US 2022/0231394 A1 Jul. 21, 2022

Related U.S. Application Data (60) Division of application No. 16/841,072, filed on Apr. 6, 2020, now Pat. No. 11,329,358, which is a
(Continued)

(51) Int. Cl.
*H01P 3/08* (2006.01)
*H01P 3/02* (2006.01)
(Continued)

(52) U.S. Cl.
CPC ............... *H01P 3/082* (2013.01); *H01P 3/02* (2013.01); *H01P 3/026* (2013.01); *H01P 3/06* (2013.01);
(Continued)

(58) Field of Classification Search
CPC ............ H01P 3/081; H01P 3/06; H01P 3/082
(Continued)

(56) References Cited

U.S. PATENT DOCUMENTS 4,673,904 A   6/1987 Landis
4,776,087 A   10/1988 Cronin et al.
(Continued)

FOREIGN PATENT DOCUMENTS

KR   10-2007-0036086   4/2007

OTHER PUBLICATIONS

International Preliminary Report on Patentability for International Patent Application No. PCT/US2016/044515, dated Apr. 5, 2018, 9 pages.
(Continued)

*Primary Examiner* — Benny T Lee
(74) *Attorney, Agent, or Firm* — Schwabe, Williamson & Wyatt, P.C.

(57) ABSTRACT

Embodiments of the invention include a packaged device with transmission lines that have an extended thickness, and methods of making such device. According to an embodiment, the packaged device may include a first dielectric layer and a first transmission line formed over the first dielectric layer. Embodiments may then include a second dielectric layer formed over the transmission line and the first dielectric layer. According to an embodiment, a first line via may be formed through the second dielectric layer and electrically coupled to the first transmission line. In some
(Continued)

embodiments, the first line via extends substantially along the length of the first transmission line.

19 Claims, 9 Drawing Sheets

Related U.S. Application Data continuation of application No. 15/997,644, filed on Jun. 4, 2018, now Pat. No. 10,651,525, which is a division of application No. 14/866,693, filed on Sep. 25, 2015, now Pat. No. 9,992,859.

(51) Int. Cl.
    *H05K 1/02*     (2006.01)
    *H01P 3/06*     (2006.01)

(52) U.S. Cl.
    CPC ............... *H01P 3/08* (2013.01); *H01P 3/085* (2013.01); *H01P 3/088* (2013.01); *H05K 1/0245* (2013.01)

(58) Field of Classification Search
    USPC .................................................. 333/238, 243
    See application file for complete search history.

(56) References Cited

U.S. PATENT DOCUMENTS

| | | |
|---|---|---|
| 5,357,138 A | 10/1994 | Kobayashi |
| 6,523,252 B1 | 2/2003 | Lipponen |
| 6,768,400 B2 | 7/2004 | Tanabe |
| 7,417,872 B2 | 8/2008 | Li et al. |
| 8,841,976 B2 | 9/2014 | Ogawa et al. |
| 9,992,859 B2 | 6/2018 | Elsherbini et al. |
| 10,651,525 B2 | 5/2020 | Elsherbini et al. |
| 2001/0040274 A1 | 11/2001 | Hidaka |
| 2006/0192288 A1 | 8/2006 | Ueno |
| 2008/0191362 A1 | 8/2008 | Chuang et al. |
| 2009/0237186 A1 | 9/2009 | Onda et al. |
| 2015/0000958 A1 | 1/2015 | Harr et al. |

OTHER PUBLICATIONS

International Search Report and Written Opinion for International Patent Application No. PCT/US2016/044515; dated Oct. 31, 2016, 12 pages.

LOW LOSS AND LOW CROSS TALK TRANSMISSION LINES WITH STACKED DIELECTRIC LAYERS FOR FORMING STUBS OF DIFFERENT THICKNESS OR FOR FORMING A COAXIAL LINE

CROSS-REFERENCE TO RELATED APPLICATIONS

This application is a Divisional of U.S. patent application Ser. No. 16/841,072, filed Apr. 6, 2020 now U.S. Pat. No. 11,329,358, issued May 10, 2022, which is a Continuation of U.S. patent application Ser. No. 15/997,644, filed Jun. 4, 2018, now U.S. Pat. No. 10,651,525, issued May 12, 2020, which is a Divisional of U.S. patent application Ser. No. 14/866,693, filed Sep. 25, 2015, now U.S. Pat. No. 9,992,859, issued Jun. 5, 2018, the entire contents of which are hereby incorporated by reference herein.

FIELD OF THE INVENTION

Embodiments generally relate to packaging for electronic devices. More specifically, embodiments relate to packaging solutions that include line vias.

BACKGROUND OF THE INVENTION

High speed On-Package I/O (OPIO) links are used extensively in server/client/high performance computing (HPC) packages and multi-chip packages (MCPs). Their most basic configurations consists of many transmission lines (e.g., microstrip or striplines) that are routed close to each other and transfer data between different chips on the package or from a silicon die on the package to the main board. Ideally, the transmission lines are routed as close to each other as possible in order to maximize the routing density and reduce the package form factor and cost. However, routing the transmission lines too close to each other may result in high signal coupling (i.e., cross-talk) between the lines. Accordingly, the minimum spacing between the lines is limited and it is common to route the lines farther apart than is otherwise possible given the current patterning processes in order to reduce the cross talk and reduce the signal processing requirements on the die side. This results in either larger package size or larger number of layers in the package, which in turn increases the package cost and/or Z-height (i.e., thickness).

DETAILED DESCRIPTION OF THE INVENTION

Described herein are systems that include lithographically defined line vias for various signal routing applications. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order to not obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

One of the main drivers for package design rules is the input/output (I/O) density per mm per layer (IO/mm/layer). The I/O density may be limited by the via pad sizes. However, current packaging technologies limit the extent to which the size of the via pads may be reduced. The via pads need to be relatively large due to the laser drilling process used to create the via openings through a dielectric layer above the via pads. Laser drilling is limited by the minimum feature size and the misalignment of the laser when drilling the via opening. For example, the minimum feature size of a laser drilled via opening may be approximately 40 μm or larger when a $CO_2$ laser is used, and the misalignment between the layers may be approximately +/−15 μm or larger. As such, the via pad sizes may need to be approximately 70 μm (i.e., 40+2(15) μm) or larger. Alternative laser sources, such as UV lasers, may be able to reduce the via opening more, but throughput is also greatly decreased. Accordingly, embodiments of the invention may utilize one or more processes that form the vias with lithographic processes instead of with lasers. The use of lithographic processes allows for an improved layer-to-layer alignment and smaller pads compared to laser drilling, which in turn results in higher I/O densities. Additionally, the throughput time is deceased with lithography-based processes because all of the vias may be formed at once (i.e., a single exposure and patterning) instead of being formed sequentially when laser drilling is used.

Furthermore, the use of lithography-based processes to form the vias allows for the vias to be formed in any desire shape. Instead of being limited to the shape of the laser, a lithographically defined via may be customized for a desired purpose. For example, whereas a laser defined via may be limited to a circular shape, embodiments of the invention may include vias that are rectangular/oval in shape or with hollow interiors that extend in a lateral direction along the transmission line. Instead of electrically coupling two transmission lines formed on different layers of a package substrate with a geometry restricted via produced with laser drilling, embodiments of the invention may allow for a line via to extend through the package substrate a length substantially equal to the length of the two transmission lines. Accordingly, the use of line vias may allow for a transmission line to be formed that has a thickness equal to the combined thicknesses of the two transmission lines plus the distance between the two transmission lines. Increasing the thickness of a transmission line has various benefits.

In one embodiment, thicker transmission lines may allow for a decrease in insertion loss, and therefore improve the efficiency of the device. An additional embodiment may include using thicker transmission lines for improved coupling between transmission lines used in differential signaling applications. The use of line vias also allows for coaxial lines to be formed in the package substrate. For example, line vias and pads may be combined to form a conductive shield around a transmission line. Additional embodiments may also allow for increased mutual capacitive coupling to reduce far end cross-talk by forming vertically oriented stubs along the transmission lines.

According to an embodiment, the line vias may be formed with a suitable lithographic patterning process. One such embodiment is illustrated and described with respect to FIGS. 1A-1H, which illustrate plan views and corresponding cross-sectional views along line 1-1'. In the illustrated embodiment, only the formation of line vias are shown, however it is to be appreciated that additional features, such as vias and/or pads, may be formed at the same time and with the same processing operations, according to embodiments of the invention.

Figure 1A:
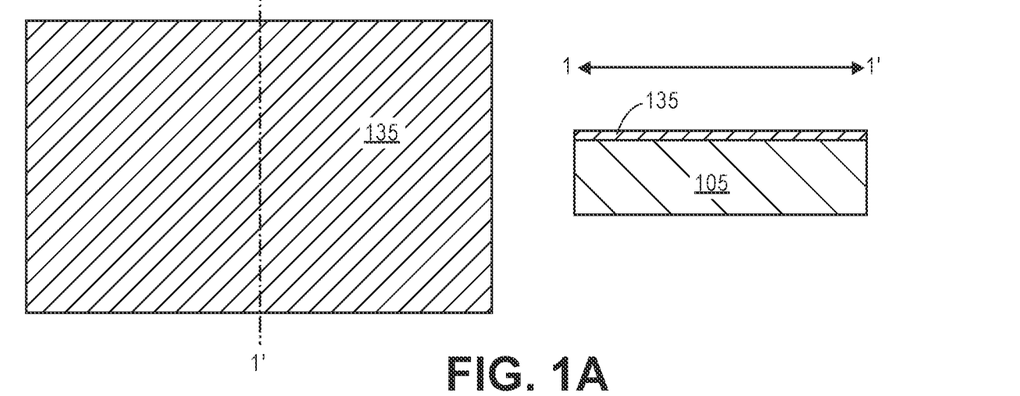
FIG. 1A is a plan view and a corresponding cross-sectional illustration of a dielectric layer with a seed layer formed over the surface, according to an embodiment of the invention.

Referring now to FIG. 1A, embodiments of the invention may include a seed layer 135 that is deposited over a top surface of a dielectric layer 105. By way of example, the dielectric layer 105 may be a polymer material, such as, for example, polyimide, epoxy or build-up film (BF). In an embodiment, the dielectric layer 105 may be one layer in a stack that includes a plurality of dielectric layers used to form a build-up structure. As such, the dielectric layer 105 may be formed over another dielectric layer. Additional embodiments may include forming the dielectric layer 105 as the first dielectric layer over a core material on which the stack is formed. In an embodiment, the seed layer 135 may be a copper seed layer. According to an additional embodiment, the layer 105 may be the bottommost layer of a package, and be a metallic material. In such embodiments, the seed layer 135 may be omitted.

Figure 1B:
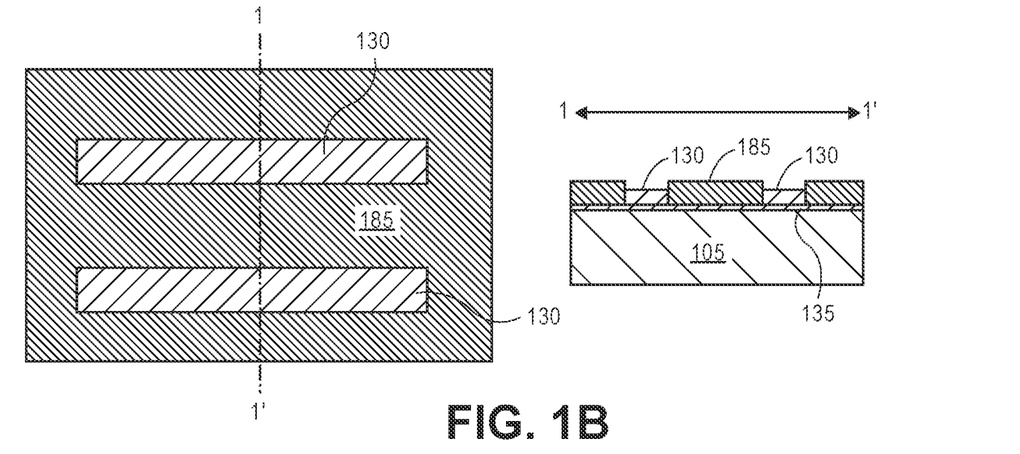
FIG. 1B is a plan view and a corresponding cross-sectional illustration of the device after transmission lines have been formed over the surface, according to an embodiment of the invention.

Referring now to FIG. 1B, a photoresist material 185 may be formed over the seed layer 135 and the dielectric layer 105 and patterned to provide openings for the formation of transmission lines 130. According to an embodiment, the patterning of the photoresist material 185 may be implemented with lithographic processes (e.g., exposed with a radiation source through a mask (not shown) and developed with a developer). After the photoresist material 185 has been patterned, the transmission lines 130 may be formed. In an embodiment, the transmission lines 130 may be formed with an electroplating process or the like.

Figure 1C:
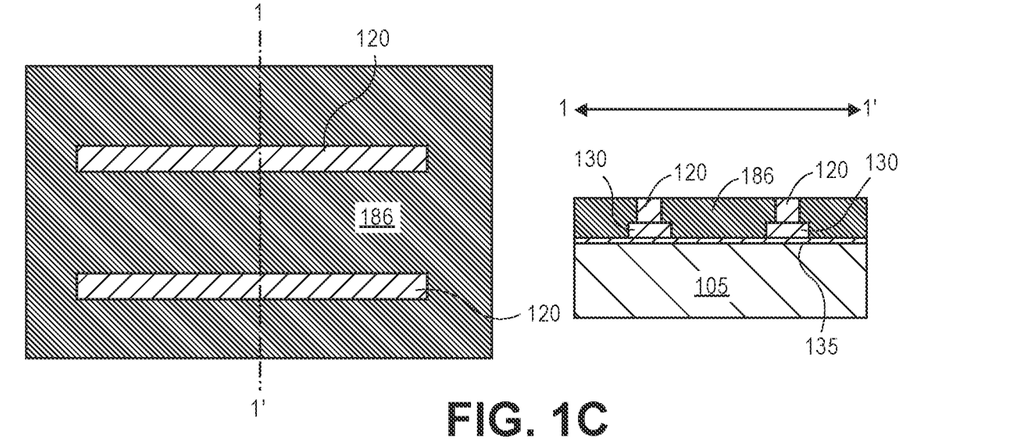
FIG. 1C is a plan view and a corresponding cross-sectional illustration of the device after a second photoresist material has been deposited and patterned to allow for a line via to be formed along each transmission line, according to an embodiment of the invention.

Referring now to FIG. 1C, the first photoresist material 185 (FIG. 1B) is stripped, and a second photoresist material 186 is deposited over the transmission lines 130, the seed layer 135, and the first dielectric layer 105. A line via opening may then be patterned into the second photoresist material 186 by exposing the second photoresist material 186 to radiation through a via layer mask (not shown) and developing with a developer. According to an embodiment, the line vias 120 may be formed in the line via opening. According to an embodiment, the line vias 120 may be formed with any suitable deposition process, such as electroplating or the like.

As illustrated in the plan view in FIG. 1C, the line vias 120 are substantially the same length as the underlying transmission lines 130. However, additional embodiments are not limited to such configurations, and the line vias 120 may be formed over selected regions of the transmission lines 130. Furthermore, as illustrated in the cross-sectional view along line 1-1', embodiments of the invention include line vias 120 that are not the same width as the transmission lines 130. Such embodiments may allow for a some misalignment between the transmission lines 130 and the line vias 120. Though the illustrated embodiment depicts a difference in the widths of the transmission lines 130 and the line vias 120, it is to be appreciated that embodiments of the invention may also include line vias 120 that are self-aligned on the transmission lines 130, and therefore may be formed with substantially similar widths. In such an embodiment, there may be no discernable difference between the width of the transmission lines 130 and the line vias 120.

Figure 1D:
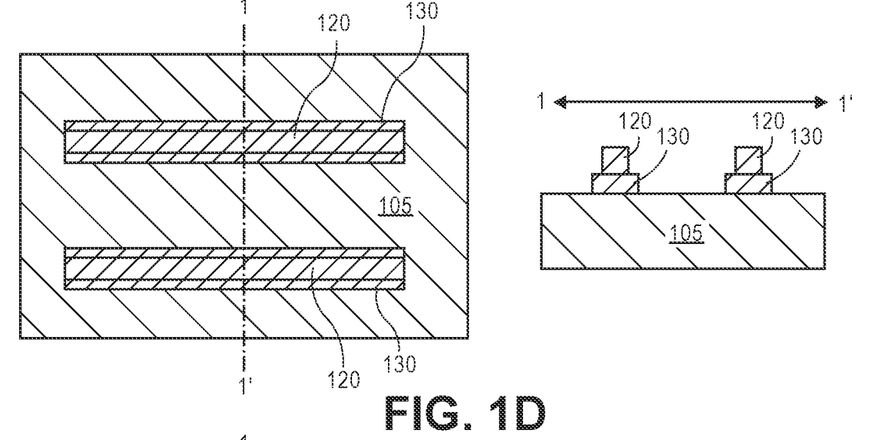
FIG. 1D is a plan view and a corresponding cross-sectional illustration of the device after the second photoresist material and the exposed portions of the seed layer have been removed, according to an embodiment of the invention.

Referring now to FIG. 1D, the second photoresist material 186 (FIG. 1C) is stripped and the remaining portions of the seed layer 135 (FIGS. 1A and 1C) are removed. According to an embodiment, the seed layer 135 may be removed from the first dielectric layer 105 with a seed etching process. As shown in the illustrated embodiment, the line via 120 formed over transmission lines 130 is formed prior to the formation of a second dielectric layer. Such embodiments of the invention may be referred to as a line via first lithography process.

Figure 1E:
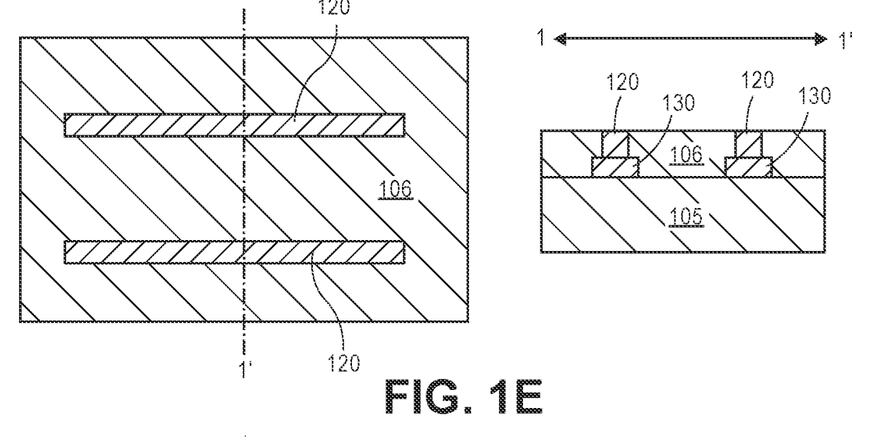
FIG. 1E is a plan view and a corresponding cross-sectional illustration of the device after a second dielectric layer has been formed over the surface, according to an embodiment of the invention.

Referring now to FIG. 1E, a second dielectric layer 106 is formed over the exposed line vias 120, transmission lines 130, and the first dielectric layer 105. According to an embodiment the second dielectric layer 106 may be formed with any suitable process, such as lamination or slit coating and curing. In an embodiment, the second dielectric layer 106 is formed to a thickness that will completely cover a top surface of the line vias 120. As opposed to layer formation on crystalline structures (e.g., silicon substrates), each of the dielectric layers may not be highly uniform. Accordingly, the second dielectric layer 106 may be formed to a thickness that is greater than the line vias 120 to ensure that the proper thickness is reached across the entire substrate. When the second dielectric is formed above the line vias, a controlled etching process may then be used to expose the top surfaces of the line vias 120, as illustrated in FIG. 1E.

In an embodiment, the dielectric removal process may include a wet etch, a dry etch (e.g., a plasma etch), a wet blast, or a laser ablation (e.g., by using excimer laser). According to an additional embodiment, the depth controlled dielectric removal process may be performed only proximate to the line vias 120. For example, laser ablation of the second dielectric layer 106 may be localized proximate to the location of the vias 120. In some embodiments, the thickness of the second dielectric layer 106 may be minimized in order to reduce the etching time required to expose the line vias 120. In other embodiments, when the thickness of the dielectric can be well controlled, the line vias 120 may extend above the top surface of the second dielectric layer 106 and the controlled dielectric removal process may be omitted.

Figure 1F:
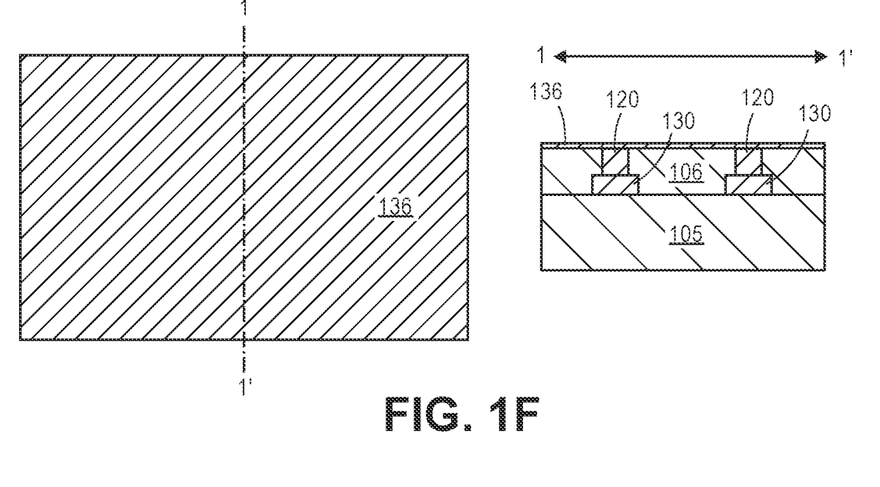
FIG. 1F is a plan view and a corresponding cross-sectional illustration of the device after a seed layer has been formed over the second dielectric layer, according to an embodiment of the invention.

Referring now to FIG. 1F, a second seed layer 136 may be formed over the exposed portions of the second dielectric layer 106 which is formed around the first transmission line 130, the line via 120, and which are both formed over the first dielectric layer 105. According to an embodiment of the invention, the second seed layer 136 is a seed layer suitable for use in growing conductive features on the surface of the second dielectric layer 106. For example, the second seed layer 136 may be a copper seed layer.

Figure 1G:
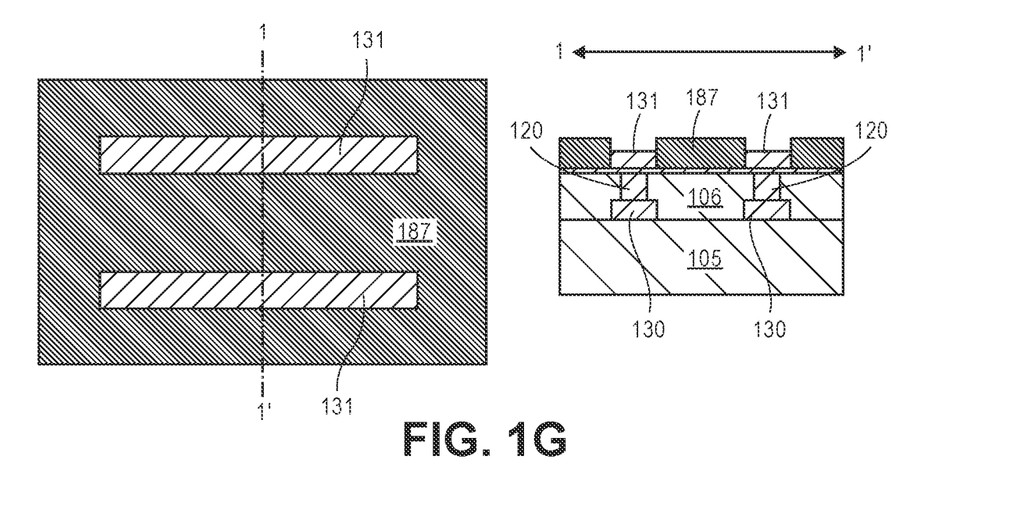
FIG. 1G is a plan view and a corresponding cross-sectional illustration of the device after a third photoresist material has been deposited and patterned to form a second transmission line over the line vias, according to an embodiment of the invention.

Referring now to FIG. 1G, a third photoresist material 187 is deposited and patterned to form openings for the a second level of conductive features, such as transmission lines 131. According to an embodiment, the next level of conductive features (similar to transmission line 130 and via line 120 formed over the first dielectric layer 105) may then be formed in the openings with a suitable process, such as electroplating or the like.

Figure 1H:
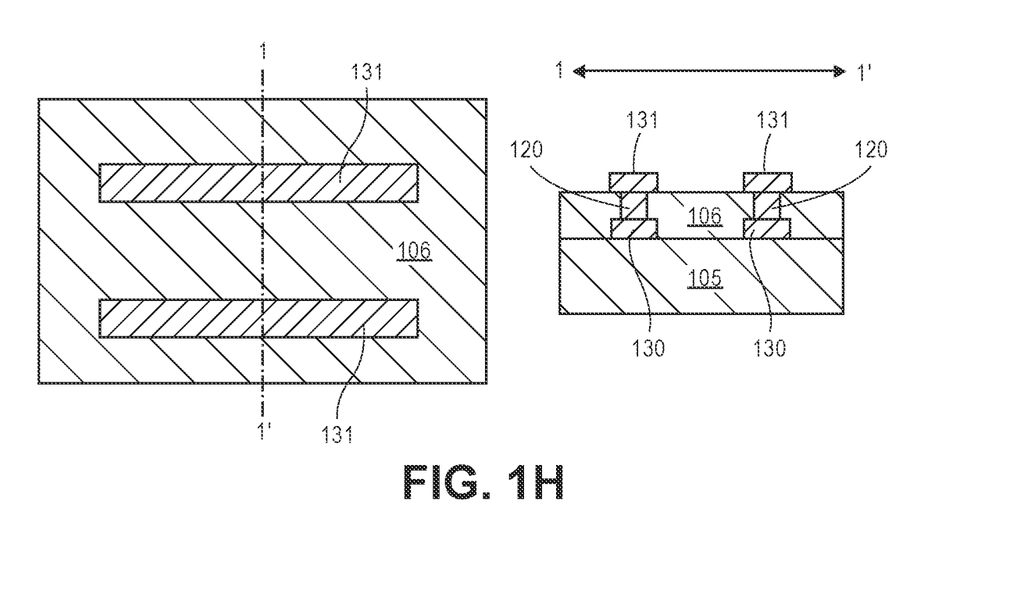
FIG. 1H is a plan view and a corresponding cross-sectional illustration of the device after the third photoresist layer and the second seed layer have been removed, according to an embodiment of the invention.

After the formation of the transmission lines 131 on the second dielectric layer 106, the third photoresist material 187 (FIG. 1G) may be removed and the second seed layer 136 (FIG. 1F) may be etched away with a seed etching process, as illustrated in FIG. 1H. According to an embodiment, the transmission lines 131 formed on the second dielectric layer 106 may be substantially similar to the transmission lines 130 formed in the first dielectric layer 105. As such, the transmission lines 131 may have a width that is greater than the width of the line vias 120. According to an additional embodiment, the transmission lines 131 may be omitted.

The illustrated embodiment includes a single layer of line vias 120, though embodiments are not limited to such configurations. For example, the processing operations described above may be repeated one or more times in order to form a plurality of line via layers. Accordingly, the thickness of a transmission line may be any desired thickness, up to the entire thickness of the package substrate. In the process flow described above with respect to FIGS. 1A-1H, the line vias 120 (FIGS. 1C to 1H) were formed and then a second dielectric layer 106 (FIGS. 1E to 1H) was formed around the line vias 120. However, embodiments are not limited to such configurations. For example, the second dielectric layer 106 may be formed first and openings may be patterned into the second dielectric layer to form the via lines, according to additional embodiments of the invention.

The use of the thicker transmission lines formed by linking two or more layers together with a line via allows for several improved transmission line configurations. One such configuration allows for reduced insertion loss in tightly pitched features. In many OPIO lines, insertion loss needs to be carefully controlled in order to reduce the required transmit power to achieve certain bit error rate (BER) at the receiver. Reducing the required transmit power improves the overall system power consumption, which is becoming a critical metric in both server and client platforms.

Figure 2A:
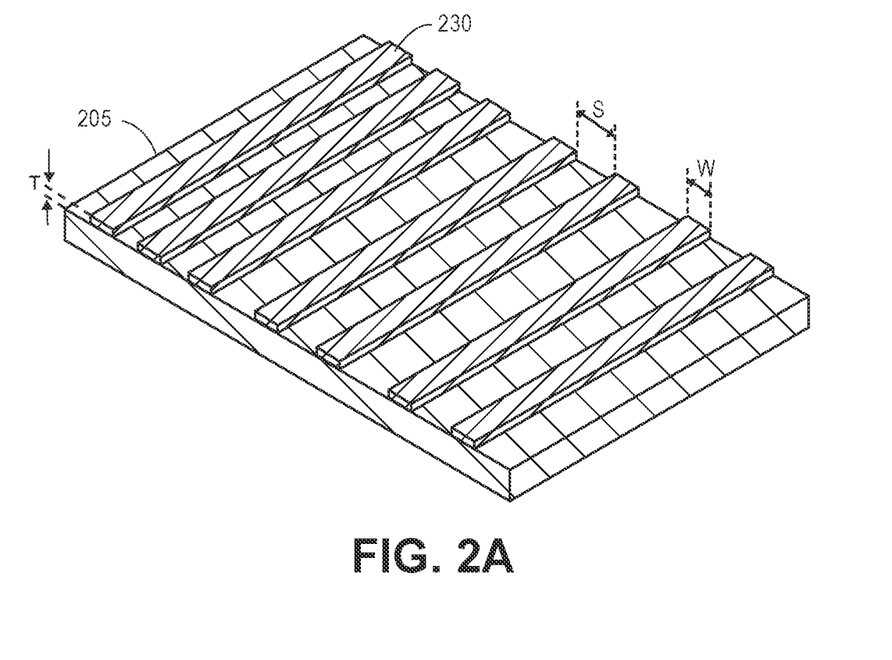
FIG. 2A is a perspective view of transmission lines formed over a dielectric layer, according to an embodiment of the invention.

FIG. 2A is a perspective view of the transmission line 230 formed over a dielectric layer 205. As illustrated, the transmission lines 230 are each formed with a width W and are spaced apart from each other by a spacing S. The insertion loss may be attributable to dielectric loss and conductor loss. In order to reduce these losses, the geometry of the transmission lines 230 may be changed. Typically, the insertion loss is reduced by using wider lines than the minimum line width possible with currently available processing operations. However, increasing the width of lines results in lower routing density.

Furthermore, the thickness T of the lines 230 is dictated by the fabrication process used to manufacture a given device. For example, in semi-additive processes (SAP) with fine line widths W and spacings S of approximately 9/10 (width/space in μm) the maximum thickness T of the transmission lines 230 may be approximately 15 μm. As line width and spacing are scaled even further, the line thickness T may also decrease to values below 15 μm. The maximum thickness T of the transmission lines is limited by manufacturing considerations, such as dielectric lamination, trace reliability (i.e., trace lifting), and the like. As such, current technologies may only allow for adjustments to the geometry of the transmission lines 230 that results in a decrease in the I/O density.

Figure 2B:
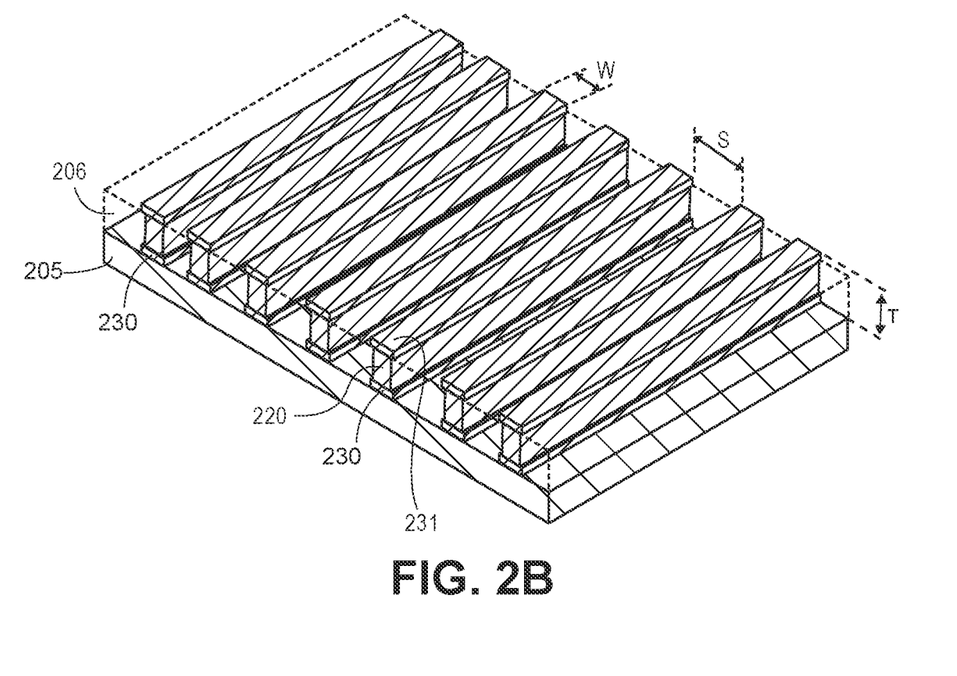
FIG. 2B is a perspective view of transmission lines that each include a line via, according to an embodiment of the invention.

Referring now to FIG. 2B, a perspective view of transmission lines according to an embodiment of the invention are illustrated. In the illustrated embodiment, the thickness T of the transmission lines is increased without compromising line/space resolution (W or S). For example, the transmission lines 230 may each include a line via 220. The line via 220 provides additional thickness to the lines 230. For example, the line vias 220 may provide any desired thickness level, up to approximately the thickness of the package substrate. According to an embodiment the combined thickness of the line vias 220 and the transmission lines 230 and 231 may be chosen to meet the system loss target. In one embodiment, a thickness increase from the 15 μm in previous technologies to approximately 40 μm, may reduce the insertion loss by approximately 25-50%.

While it is appreciated that the height of the line vias 220 may be any desired value, additional considerations that need to be accounted for, such as dielectric material thicknesses and metal deposition processes, may determine the thicknesses that are more conducive to fabrication processes. For example, the thickness of the dielectric materials that are available from suppliers may be a practical limitation to the desired thickness of the line via. In the illustrated embodiment, the thickness is the combined thickness of the first transmission line 230, the lithographically defined line via 220, and the second transmission line 231. As such, if the choices are made so that the first and second transmission lines 230, 231 are approximately 15 μm thick and the available dielectric layer 206 laminated over the first dielectric layer 205 is approximately 10 μm, then the transmission line may only be thickened from 15 μm (i.e., the single conductive trace 230 illustrated in FIG. 2A) to approximately 40 μm by using embodiments of the invention and not to other values between approximately 15 μm and 40 μm. However, as noted above, the thickness of the dielectric layer 206 may be chosen to provide a desired overall thickness T.

In the embodiment illustrated in FIG. 2B, the transmission lines include first transmission lines 230, line vias 220, and second transmission lines 231. However, additional embodiments of the invention are not limited to such configurations. For example, the second transmission lines 231 may be omitted from the top surfaces of the line vias 220. This may be useful for providing increased flexibility in the overall thickness of the transmission line to provide a desired insertion loss. Additional embodiments may also include the omission of the first transmission line 230. Alternative embodiments may include a line via 220 that is self-aligned with the first and second transmission lines 230, 231, and therefore, a transmission line with a uniform width may also be produced according to embodiments of the invention. Since the width W of the transmission lines may be decreased when the line vias 220 are self-aligned with the transmission lines 230, 231, the I/O density may also be increased.

Figure 3A:
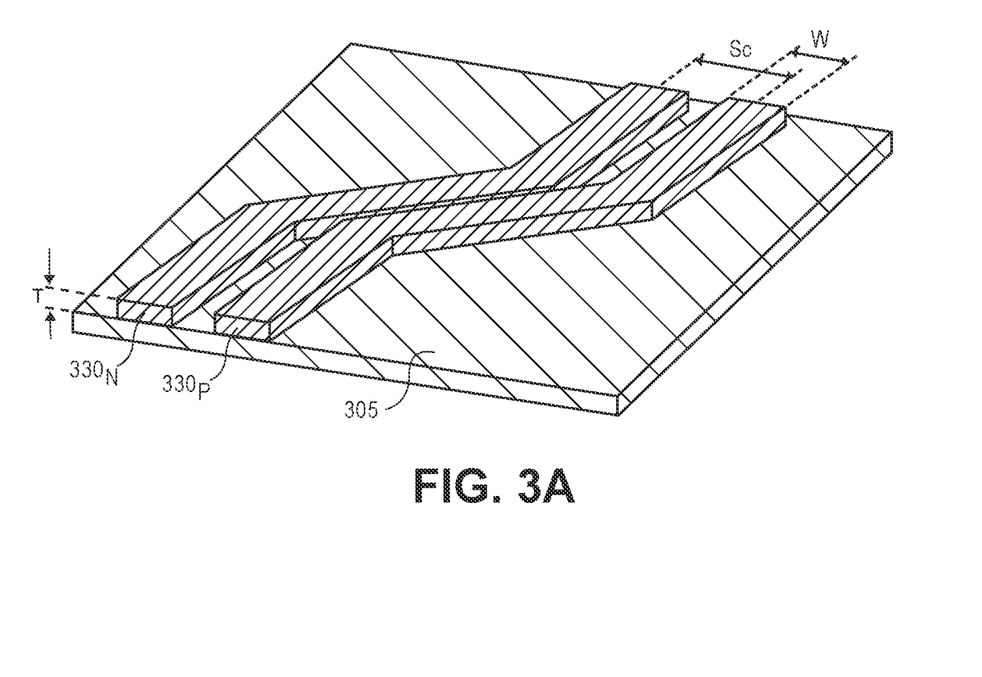
FIG. 3A is a perspective view of a pair of transmission lines that are coupled to form a differential signal transmission path, according to an embodiment of the invention.

According to an additional embodiment of the invention, the use of thicker transmission lines may also be beneficial in differential signaling applications. In differential signaling applications a pair of transmission lines are placed close together and should have high coupling with each other. In FIG. 3A, a perspective view of a pair of transmission lines $330_N$ and $330_P$ formed over first dielectric layer 305 are shown. In order to increase the coupling between the two lines, the spacing $S_c$ between the centerlines is minimized. However, the width W of the lines typically needs to be increased to a width greater than the minimum feature width possible with current patterning techniques in order to provide adequate impedance values for the transmission lines. For example, the width of the lines should be sufficient to provide an impedance of approximately 100 ohms or less. Accordingly, the width W needs to be increased because the thickness T of the lines $330_N$ and $330_P$ cannot be increased with typical processing operations, as described above. Since the transmission lines need to have an increased width W, the I/O density is also decreased.

Figure 3B:
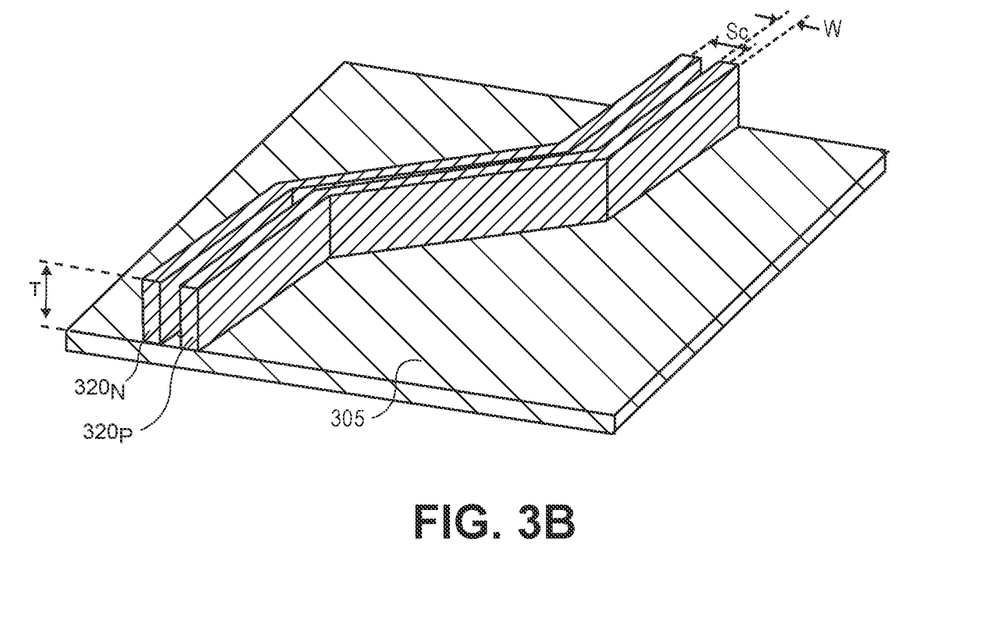
FIG. 3B is a perspective view of a pair of transmission lines that each include a line via, according to an embodiment of the invention.

Instead of relying on the use of wider transmission lines to provide the desired impedance, embodiments of the invention may utilize transmission lines that have an increased thickness T and reduced width W. For example, in FIG. 3B, the line vias $320_N$ and $320_P$, formed over a dielectric layer 305, may have a cross-sectional area that is substantially similar to the cross-sectional area of the transmission lines $330_N$ and $330_P$ in FIG. 3A. As such, the impedances may be similar to each other. However, the spacing $S_c$ between the center lines may be reduced because the added cross-sectional area is located in the Z-plane (i.e., thickness) instead of in the horizontal plane. Accordingly, the same (or reduced) impedance may be obtained without sacrificing the I/O density. Furthermore, improved coupling between the transmission lines is achieved due to the reduction in the spacing $S_c$ between the center line of each line vias $320_N$ and $320_P$.

In the illustrated embodiment, the differential transmission lines are illustrated as being only formed with a line via $320_N$ and $320_P$. However, embodiments are not limited to such configurations. For example, the line vias $320_N$ and $320_P$ may be formed over first transmission lines and/or formed below second transmission lines that are substantially similar to the transmission lines 230 and 231 illustrated in FIG. 2B. The use of first and/or second transmission line may provide an increased thickness T to the transmission line, and therefore reduce the impedance. However, it is to be appreciated that the inclusion of either a first or second transmission line may also result in the spacing $S_c$ being increased relative to the embodiment illustrated in FIG. 3B. While the spacing $S_c$ in such an embodiment may be increased with respect to the embodiment illustrated in FIG. 3B, it is to be appreciated that the spacing $S_c$ may still be less than the spacing required when line vias $320_N$ and $320_P$ are not present (e.g., as is the case in the device illustrated in FIG. 3A).

Figure 4A:
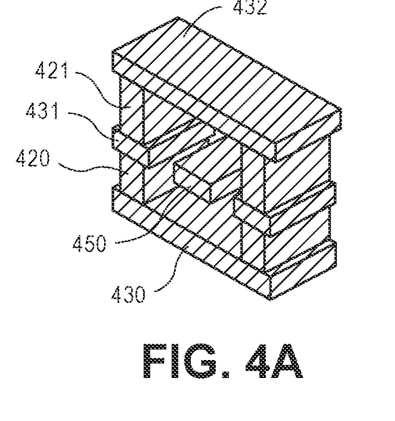
FIG. 4A is a perspective view of a portion of a coaxial transmission line that is formed with the use of line vias, according to an embodiment of the invention.

According to an additional embodiment, the use of line vias to extend the thickness of transmission lines may also be utilized to form coaxial transmission lines within a package substrate. Such an embodiment is illustrated in FIG. 4A. FIG. 4A only illustrates the conductive features within the package, and the dielectric layers are omitted to not unnecessarily obscure particular embodiments of the invention.

A coaxial transmission line is formed by surrounding a transmission line 450 with a conductive shield 400. According to an embodiment, the conductive shield 400 may be comprised of a first pad 430 that is coupled to a second pad 432 by one or more layers of line vias 420/421 and intermediate wall lines 431 that serve as sidewalls for the conductive shield. According to an embodiment, the shield 400 may be held at ground potential. Accordingly, transmission line 450 formed within the conductive shield 400 may transmit data with minimal interference (e.g., cross-talk) from neighboring lines outside of the conductive shield 400.

Figure 4B:
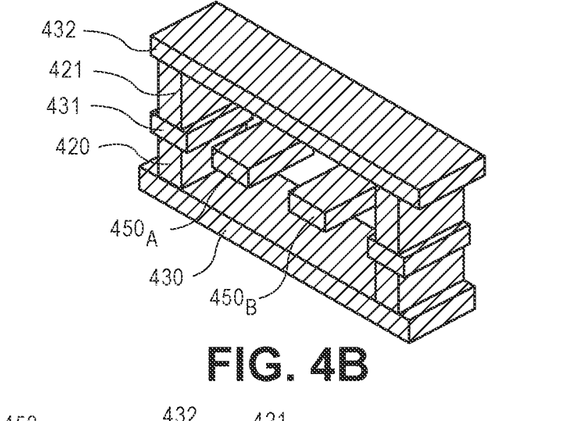
FIG. 4B is a perspective view of a twinaxial transmission line that is formed with the use of line vias, according to an embodiment of the invention.
Figure 4C:
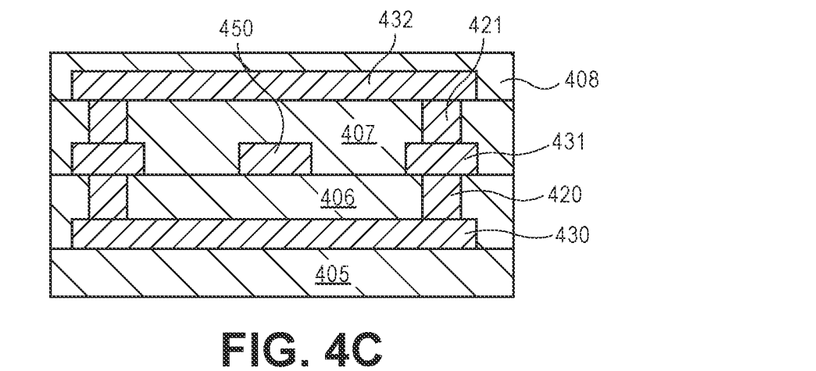
FIG. 4C is a cross-sectional view of a coaxial transmission line formed in a packaging substrate, according to an embodiment of the invention.

FIG. 4C provides a cross-sectional view that may be useful in showing how the dielectric layers are formed around the conductive shield 400 (FIG. 4A). As illustrated, the first pad 430 may be formed over a first dielectric layer 405. The first pad 430 may be formed in substantially the same way as the first transmission lines 130 are formed above with respect to FIG. 1B. In an embodiment, the first pad 430 may be formed with a width that is wide enough for the sidewalls (i.e., the first line vias 420) to be formed along opposite edges of the first pad 430. In an embodiment, a second dielectric layer 406 may be formed over the first pad 430 and around the first line vias 420. According to an embodiment, an intermediate wall line 431 may be formed over the top surfaces of the first line vias 420. The intermediate wall line 431 is substantially similar to the second transmission lines 131 described above with respect to FIG. 1H. According to an embodiment, the transmission line 450 may be formed with the same processing operations used to form the intermediate wall lines 431. A second line via 421 may then be formed over the intermediate wall lines 431, and a third dielectric layer 407 may be formed over the intermediate wall lines 431 and the transmission line 450 and around the second line vias 421. According to an embodiment, a second pad 432 may be formed over the third dielectric layer 407 and coupled to the second line vias 421. In an embodiment, one or more dielectric layers 408 may be formed over the second pad 432.

In the illustrated embodiment, the transmission line 450 is separated from the first pad 430 and the second pad 432 by a single dielectric layer (i.e., layers 406 and 407, respectively). However, it is to be appreciated that the first and second pads may have more than one layer of dielectric material separating them from transmission line 450. In such embodiments the sidewalls may comprise more than two pairs of line vias 420, 421.

According to an additional embodiment, a plurality of transmission lines 450A and 450B may be formed in a single conductive shield 401. Such an embodiment is illustrated in the perspective view shown in FIG. 4B. In FIG. 4B, a twinaxial transmission line formed within a conductive shield 401 is shown that includes a first transmission line 450A and a second transmission line 450E. Such a device may be beneficial when a differential signal with low interference is needed. The conductive shield 401 formed by the first and second pads 430, 432, the first and second line vias 420, 421, and the intermediate wall lines 431 provides additional protection from interference. Furthermore, it is to be appreciated that other types of transmission line(s) may be formed within a conductive shield. For example, entire byte groups or busses may be implemented within a coaxial configuration that is made possible with lithographically defined line vias, according to embodiments of the invention.

Figure 4D:
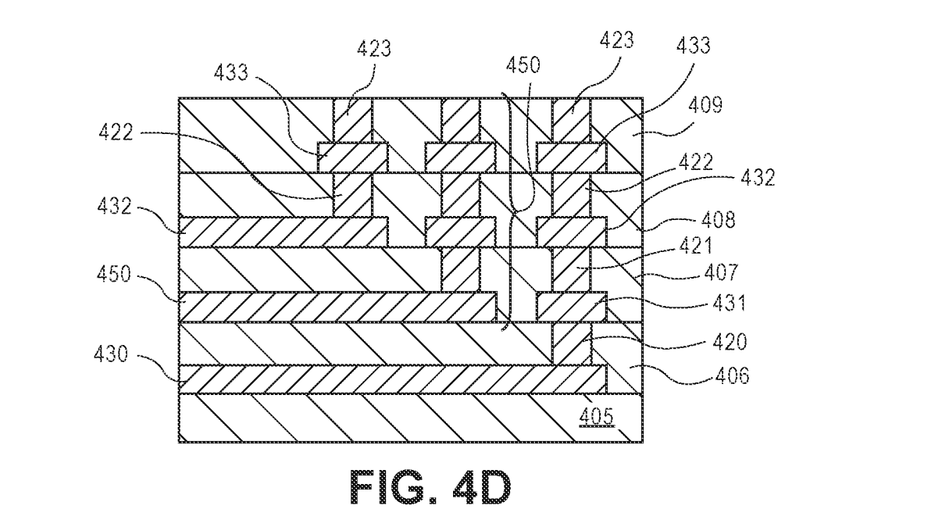
FIG. 4D is a cross-sectional view of a coaxial transmission line at the point where the transmission line changes direction, according to an embodiment of the invention.

Coaxial transmission lines are also not limited to passing a signal along a single layer of dielectric material. For example, FIG. 4D is a cross-sectional illustration of a coaxial transmission line that includes a junction that allows for the transmission line 450 to travel along the plane of the dielectric layers and pass through one or more dielectric layers 408/409 in a vertical direction. In the illustrated embodiment, a first pad 430 may be formed over a first dielectric layer 405 and a second pad 432 may be formed over a third dielectric layer 407. In such an embodiment a transmission line 450 may be formed over a second dielectric layer 406 that is positioned between the first pad 430 and the third pad 432. At the junction where the transmission line transitions to being routed through dielectric layers in the vertical direction, embodiments of the invention may include alternating line vias and pads that also extend through the dielectric layers.

For example, the portion of the conductive shield formed to the right of the transmission line 450 (as the transmission line extends in the vertical direction) may consist of a first line via 420, a first intermediate wall line 431, a second line via 421, a second intermediate wall line 432, a third line via 422, a third intermediate wall line 433, and a fourth line via 423. The portion of the conductive shield formed to the left of the transmission line 450 (as the transmission line extends in the vertical direction) may consist of the third line via 422, the third intermediate wall line 432, and the fourth line via 423. While the illustrated embodiment includes up to four line vias, it is to be appreciated that more line vias may be included if the transmission line 450 continues in the vertical direction through additional dielectric layers, or fewer line vias may be needed if the transmission line 450 passes through fewer dielectric layers.

Those skilled in the art will also recognize that the intermediate wall lines and pads that are formed on the same dielectric level may be formed as a single continuous feature that are connected to each other out of the plane illustrated in FIG. 4D, and therefore, are referred to with the same reference numeral (e.g., the second pad 432 and the second intermediate wall line 432 may be formed from a single continuous conductive feature). According to an embodiment, the line vias that are formed through the same dielectric layers may also be a single line via that is connected out of the plane illustrated in FIG. 4D, and therefore, are referred to with the same reference numeral (e.g., the third line via 422 positioned to the right of the transmission line 450 and the third line via 422 positioned to the left of the transmission line 450 may be a single continuous line via). Additionally, it is to be appreciated that if the line vias are formed with a self-aligned process, the intermediate wall lines may be omitted. In addition to embodiments of the invention that have a coaxial transmission line passing through multiple layers of the package substrate, embodiments may also include a transmission line that is surrounded by a conductive shield in some portions of the package and is a stripline transmission line without a conductive shield in other portions of the package. According to an embodiment, the vertical vias and side walls may have any desired shape, such as circular or elliptical, and are not limited to rectangular shapes.

According to yet another embodiment of the invention, transmission lines with extended thicknesses made possible by lithographically defining line vias may allow for improved far end cross-talk (FEXT) reduction. FEXT refers to interference between two channels as measured at an end of a path opposite from that of the transmitter. FEXT for any single-ended channel is a function of the difference between the ratio of self-capacitance of the transmission line and mutual capacitance between two transmission lines and the ratio of the self-inductance of the transmission line and mutual inductance between two transmission lines.

Figure 5A:
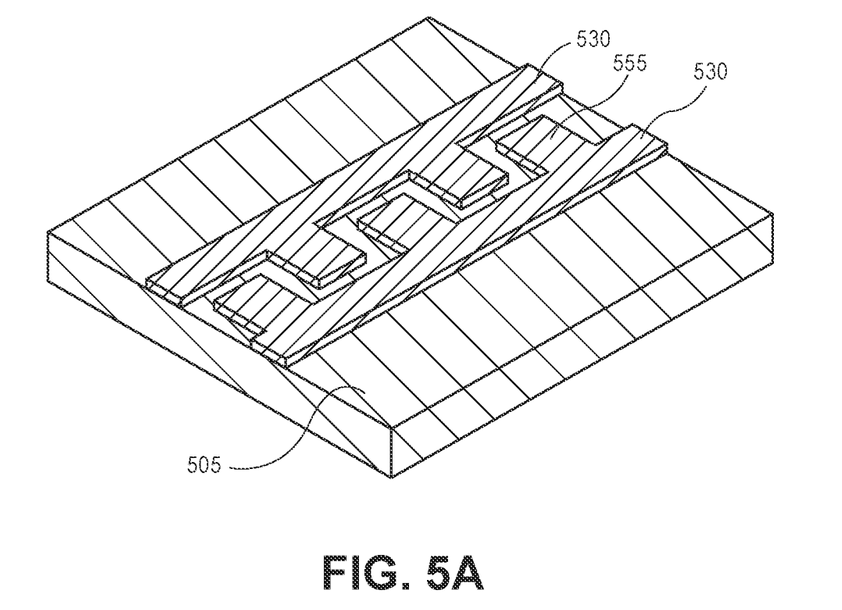
FIG. 5A is a perspective view of a pair of transmission lines that include interdigitated stubs, according to an embodiment of the invention.

Typically, the mutual capacitance in standard package transmission lines is small since mutual capacitance is based on edge to edge capacitance. One way of increasing the mutual capacitance of neighboring transmission lines is to increase the common edge length between transmission lines. For example, FIG. 5A is a plan view of a pair of neighboring transmission lines 530 formed over dielectric layer 505 that have interdigitated stubs 555. Since the interdigitated stubs 555 increase the common edge length, the mutual capacitance between the transmission lines 530 is also increased.

Figure 5B:
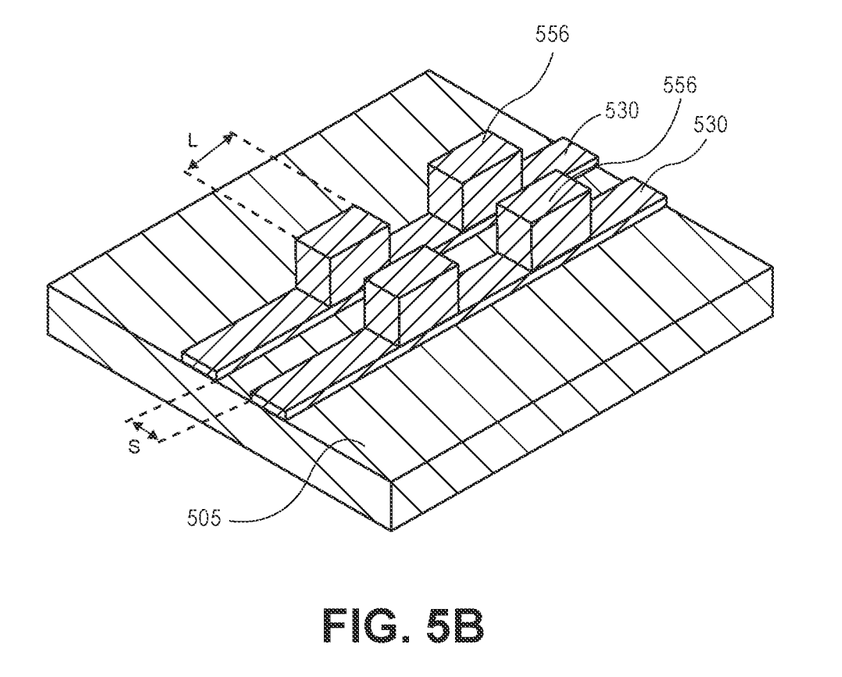
FIG. 5B is a perspective view of a pair of transmission lines with vertically oriented stubs, according to an embodiment of the invention.

However, since the thickness of the transmission lines are limited by the fabrication processes used to form the package, as described above, the amount of mutual coupling is limited as well. Accordingly, embodiments of the invention may use lithographically defined line vias to increase the thickness of portions of the transmission lines in order to achieve higher mutual capacitance. As illustrated in FIG. 5B, embodiments of the invention may utilize vertically oriented stubs 556 that are formed over the transmission lines 530 that are formed over dielectric layer 505. The formation of the vertically oriented stubs 556 may be implemented in substantially the same manner as described above with respect to FIGS. 1A-1H, with the exception that the line vias are not formed along the entire length of the transmission line 530. Instead, the amount of mutual capacitance can be tuned by forming stubs with a desired geometry. For example, the length L of each stub 556 may be chosen to provide a desired mutual capacitance (i.e., an increase in the length L of the stubs 556 increases the mutual capacitance). Additionally, the use of vertically oriented stubs 556 allows for the line spacing between the transmission lines 530 to be decreased since no room is needed for the planar interdigitated stubs, as is required in the transmission lines illustrated in FIG. 5A.

Since the vertically oriented stubs 556 are formed with a lithographic process, such as the one described above, the spacing S between each of the stubs can be as small as the minimum line to line spacing in the package technology used. In contrast, the small spacing of the vertically oriented stubs 556 cannot be produced with current via formation technology (e.g., laser drilling) because larger dimensions and spacing are needed to account for the shape of the laser used to pattern the via openings and the misalignment between layers.

Figure 5C:
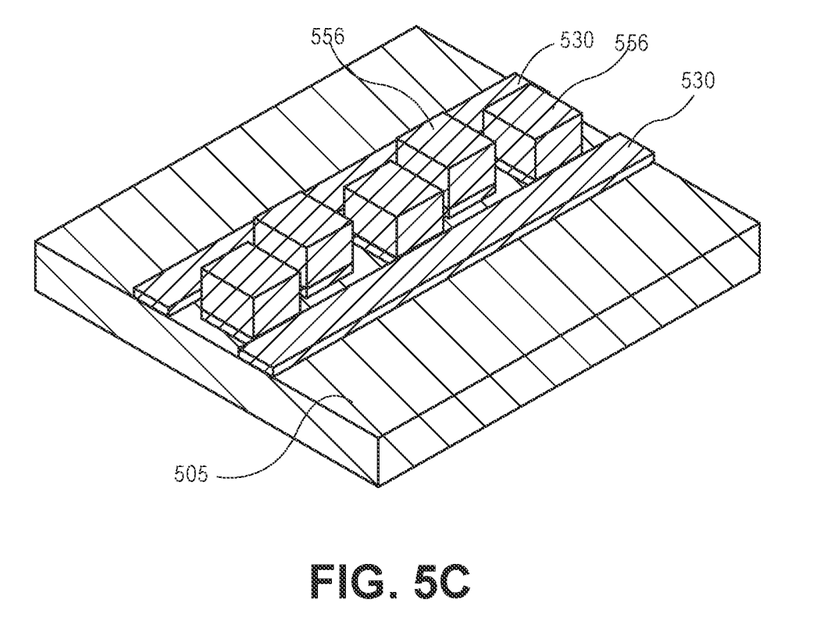
FIG. 5C is a perspective view of a pair of transmission lines that include vertically oriented interdigitated stubs, according to an embodiment of the invention.

Additional embodiments of the invention may also utilize vertically oriented stubs 556 that are interdigitated with each other. Such an embodiment is illustrated in FIG. 5C. As illustrated, the transmission lines 530 that are formed over dielectric layer 505 may be formed with a shape substantially similar to the transmission lines 530 illustrated in FIG. 5A, with the exception that lithographically patterned vertically oriented stubs 556 may be formed over the interdigitated portions the transmission lines 530. Accordingly, the mutual capacitance may be increased even more than is possible with just vertically oriented stubs since there is greater surface area shared between the two transmission lines 530.

Figure 5D:
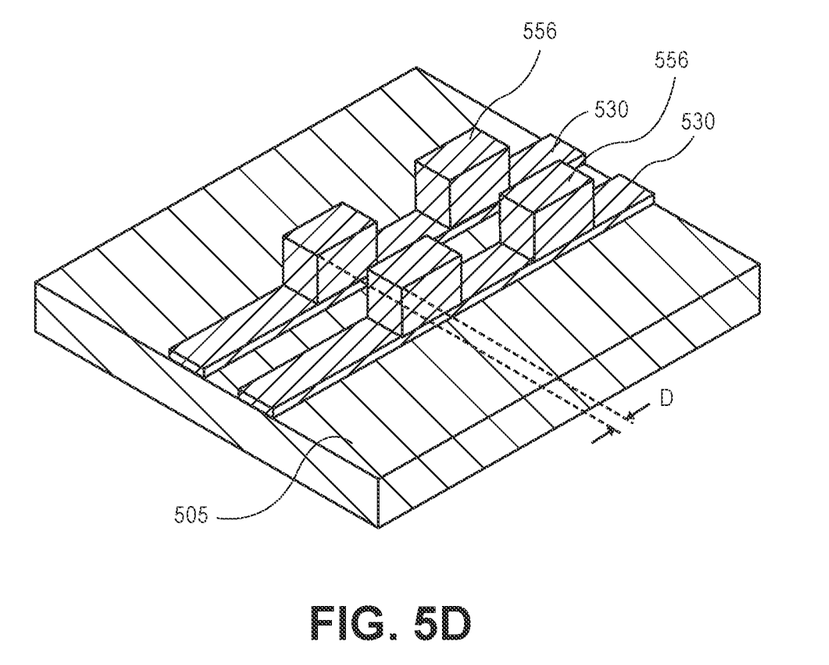
FIG. 5D is a perspective view of a pair of transmission lines with vertically oriented stubs that are offset from each other, according to an embodiment of the invention.

In yet another embodiment of the invention, the vertically oriented stubs 556 may be offset from each other a distance D, as illustrated in FIG. 5D. Offsetting the vertically oriented stubs 556 may allow for the mutual capacitance to be tuned without needing to alter the dimensions of the vertically oriented stubs. For example, as the displacement D is increased, the mutual capacitance is decreased since less surface area of each of the vertically oriented stub 556 is facing the stub 556 on the opposing transmission line 530 that is formed over dielectric layer 505.

Figure 6:
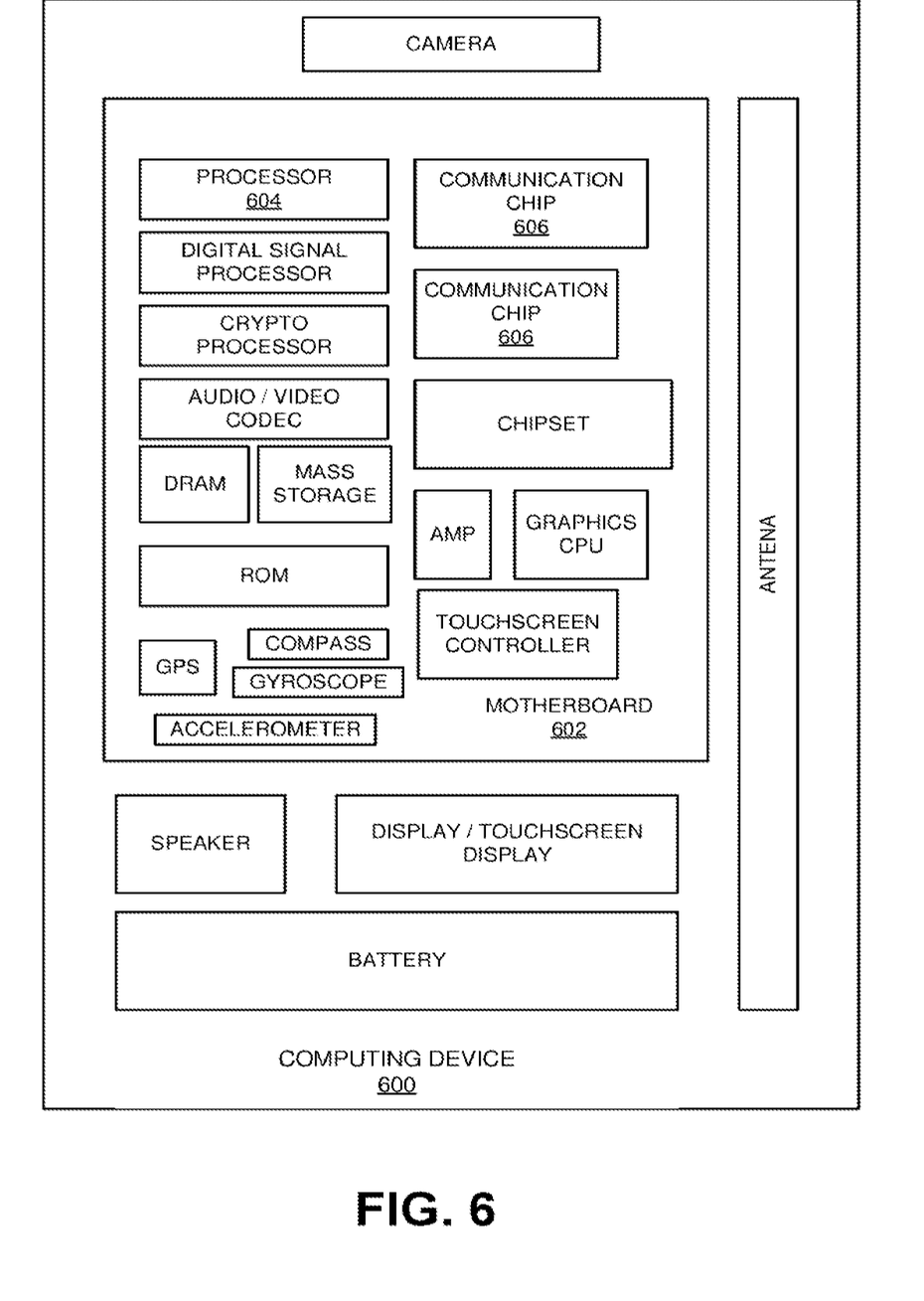
FIG. 6 is an illustration of a schematic block diagram of a computer system that utilizes a semiconductor package, according to an embodiment of the invention.

FIG. 6 illustrates a computing device 600 in accordance with one implementation of the invention. The computing device 600 houses a board 602, such as a motherboard. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics CPU or processor, a digital signal processor, a crypto processor, a chipset, an antenna, a display, a touchscreen display, a touchscreen controller, a battery, an audio codec, a video codec, a power amplifier (AMP), a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (Institute of Electrical and Electronics Engineers (IEEE) 802.11 family), Worldwide Interoperability for Microwave Access (WiMAX) (IEEE 802.16 family), IEEE 802.20, long term evolution (LTE), Evolution-Data Optimized (Ev-DO), High Speed Packet Analysis (HSPA+), High Speed Downlink Packet Analysis (HSDPA+), High Speed Uplink Packet Analysis (HSUPA+), Enhanced Data rates for Global Systems Mobile Communications Evolution (EDGE), Global System for Mobile Communications (GSM), General Packet Radio Service (GPRS), Code Division Multiple Access (CDMA), Time Division Multiple Access (TDMA), Digital Enhanced Cordless Telecommunications (DECT), Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die may be packaged with one or more devices on a package substrate that includes a thermally stable RFIC and antenna for use with wireless communications, in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may be packaged with one or more devices on a package substrate that includes one or more line vias used to form a feature such as those described herein, in accordance with various embodiments of the invention.

The following examples pertain to further embodiments. The various features of the different embodiments may be variously combined with some features included and others excluded to suit a variety of different applications.

Embodiments of the invention include a packaged device comprising: a first dielectric layer; a first transmission line formed over the first dielectric layer; a second dielectric layer formed over the transmission line and the first dielectric layer; and a first line via formed through the second dielectric layer and electrically coupled to the first transmission line, wherein the first line via extends substantially along the length of the first transmission line.

Additional embodiments include a packaged device, further comprising: a second transmission line formed over the first dielectric layer, wherein the second transmission line is positioned next to the first transmission line; and a second line via formed over the second transmission line, wherein the second line via extends substantially along the length of the second transmission line.

Additional embodiments include a packaged device, wherein the first transmission line and line via and the second transmission line and line via form a differential signal pair.

Additional embodiments include a packaged device, wherein the first transmission line and the second transmission line are spaced apart from each other by a distance less than approximately 10 µm.

Additional embodiments include a packaged device, wherein a first upper transmission line is formed over the second dielectric layer and electrically coupled to the first line via, and a second upper transmission line is formed over the second dielectric layer and electrically coupled to the second line via.

Additional embodiments include a packaged device, wherein a combined thickness of the first transmission line, the first line via, and the first upper transmission line is approximately 40 µm or greater.

Embodiments of the invention include a packaged device, comprising: a coaxial transmission line integrated into a dielectric package substrate, comprising: a conductive shield; and a transmission line formed inside the conductive shield.

Additional embodiments include a packaged device, wherein the conductive shield comprises: a first conductive pad formed over a first substrate layer; a first dielectric layer formed over the first conductive pad and the first substrate layer; a pair of first line vias formed through the first dielectric layer and coupled to opposite ends of the first conductive pad; a pair of first intermediate wall lines each formed over one of the first line vias; a second dielectric layer formed over the first dielectric layer and over the first intermediate wall lines; a pair of second line vias each coupled to one of the first intermediate wall lines; and a second conductive pad formed over the second dielectric layer and coupled to each of the second line vias.

Additional embodiments include a packaged device, wherein at least a portion of the transmission line extends along a vertical direction within the package substrate.

Additional embodiments include a packaged device, wherein a plurality of transmission lines are formed within the conductive shield.

Additional embodiments include a packaged device, wherein a first transmission line and a second transmission line are formed within the conductive shield, and wherein the first and second transmission lines are a differential signal pair.

Additional embodiments include a packaged device, wherein the plurality of transmission lines are an entire byte group.

Additional embodiments include a packaged device, wherein the plurality of transmission lines are a bus.

Additional embodiments include a packaged device, wherein a portion of the transmission line is a stripline that is not within a conductive shield at a location within the package substrate.

Embodiments of the invention include a packaged device, comprising: a first dielectric layer; a first transmission line formed over the first dielectric layer; a second dielectric layer formed over the transmission line and the first dielectric layer; and a plurality of vertically oriented stubs formed through the second dielectric layer and electrically coupled to the first transmission line.

Additional embodiments include a packaged device, further comprising: a second transmission line formed over the first dielectric layer, wherein the second transmission line is positioned next to the first transmission line; and a second plurality of vertically oriented stubs formed over the second transmission line.

Additional embodiments include a packaged device, wherein the first plurality of vertically oriented stubs are aligned with the second plurality of vertically oriented stubs.

Additional embodiments include a packaged device, wherein the first plurality of vertically oriented stubs are offset from the second plurality of vertically oriented stubs.

Additional embodiments include a packaged device, wherein a distance of the offset between the first plurality of vertically oriented stubs and the second plurality of vertically oriented stubs is chosen to provide a desired mutual capacitive coupling between the first transmission line and the second transmission line.

Additional embodiments include a packaged device, wherein the first plurality of vertically oriented stubs are interdigitated with the second plurality of vertically oriented stubs.

What is claimed is:

1. A packaged device, comprising:
    a stack of dielectric layers;
    a first transmission line within the stack of dielectric layers, wherein the first transmission line comprises:
        a first linear portion having a first thickness; and
        a plurality of first stubs extending out from an edge of the first linear portion, wherein the plurality of first stubs have a second thickness that is greater than the first thickness; and
    a second transmission line within the stack of dielectric layers, wherein the second transmission line comprises:
        a second linear portion having the first thickness; and
        a plurality of second stubs extending out from an edge of the second linear portion, wherein the plurality of second stubs have the second thickness.

2. The packaged device of claim 1, wherein the plurality of second stubs are interdigitated with the plurality of first stubs.

3. The packaged device of claim 1, wherein individual ones of the plurality of first stubs and individual ones of the plurality of second stubs comprise:
    a pad; and
    a via over the pad.

4. The packaged device of claim 3, wherein individual ones of the plurality of first stubs and individual ones of the plurality of second stubs comprise a shape, wherein the shape includes a rectangular cross-section.

5. A packaged device, comprising:
    a stack of dielectric layers; and
    a coaxial transmission line disposed within the stack of dielectric layers, wherein the coaxial transmission line passes from a first layer of the stack of dielectric layers to a second layer of the stack of dielectric layers, wherein the coaxial transmission line comprises:
        a first transmission line in the first layer of the stack of dielectric layers;
        a via over the first transmission line;

a second transmission line in the second layer of the stack of dielectric layers, wherein the via connects the first transmission line to the second transmission line; and a conductive shield surrounding the first transmission line, the via, and the second transmission line.

6. The packaged device of claim 5, further comprising:
a third transmission line in the first layer of the stack of dielectric layers;
a second via over the third transmission line; and
a fourth transmission line in the second layer of the stack of dielectric layers, wherein the second via connects the third transmission line to the fourth transmission line.

7. The packaged device of claim 6, wherein the conductive shield surrounds the third transmission line, the second via, and the fourth transmission line.

8. The packaged device of claim 5, wherein the via passes through two or more dielectric layers of the stack of dielectric layers.

9. The packaged device of claim 5, wherein the conductive shield comprises:
a first vertical wall and a second vertical wall, wherein the first vertical wall is taller than the second vertical wall.

10. A system, comprising:
a board; and
a packaged device coupled to the board, the packaged device comprising:
a stack of dielectric layers;
a first transmission line within the stack of dielectric layers, wherein the first transmission line comprises:
a first linear portion having a first thickness; and
a plurality of first stubs extending out from an edge of the first linear portion, wherein the plurality of first stubs have a second thickness that is greater than the first thickness; and
a second transmission line within the stack of dielectric layers, wherein the second transmission line comprises:
a second linear portion having the first thickness; and
a plurality of second stubs extending out from an edge of the second linear portion, wherein the plurality of second stubs have the second thickness.

11. The system of claim 10, further comprising:
a display coupled to the board.
12. The system of claim 10, further comprising:
a camera coupled to the board.
13. The system of claim 10, further comprising:
a battery coupled to the board.
14. The system of claim 10, further comprising:
a GPS coupled to the board.
15. A system, comprising:
a board; and
a packaged device coupled to the board, the packaged device comprising:
a stack of dielectric layers; and
a coaxial transmission line disposed within the stack of dielectric layers, wherein the coaxial transmission line passes from a first layer of the stack of dielectric layers to a second layer of the stack of dielectric layers, wherein the coaxial transmission line comprises:
a first transmission line in the first layer of the stack of dielectric layers;
a via over the first transmission line;
a second transmission line in the second layer of the stack of dielectric layers, wherein the via connects the first transmission line to the second transmission line; and
a conductive shield surrounding the first transmission line, the via, and the second transmission line.

16. The system of claim 15, further comprising:
a display coupled to the board.
17. The system of claim 15, further comprising:
a camera coupled to the board.
18. The system of claim 15, further comprising:
a battery coupled to the board.
19. The system of claim 15, further comprising:
a GPS coupled to the board.

* * * * *